United States Patent [19]

Smith

[11] Patent Number: 5,561,305
[45] Date of Patent: Oct. 1, 1996

[54] METHOD AND APPARATUS FOR PERFORMING INTERNAL DEVICE STRUCTURE ANALYSIS OF A DUAL CHANNEL TRANSISTOR BY MULTIPLE-FREQUENCY SCHUBNIKOV-DE HAAS ANALYSIS

[75] Inventor: Doran D. Smith, Brick, N.J.

[73] Assignee: The United States of America as represented by the Secretary of the Army, Washington, D.C.

[21] Appl. No.: 199,031

[22] Filed: Feb. 16, 1994

[51] Int. Cl.$^6$ .................................................. H01L 31/0328
[52] U.S. Cl. ........................... 257/194; 257/287; 257/368; 257/421; 257/48
[58] Field of Search .................................... 257/194, 272, 257/287, 368, 421, 48

[56] References Cited

U.S. PATENT DOCUMENTS 4,821,093  4/1989  Iafrate et al. ............................. 357/22

OTHER PUBLICATIONS

Smith et al., "A Selectively-Contacted Dual Channel High Electron Mobility Transistor," *Army Science Conference Proceedings*, vol. 3, 1990, pp. 347–355.

Khanna et al., "A Selectively Contacted Dual–Channel HEMT," *IEEE Electron Device Letters*, vol. 10, No. 12, Dec. 1989, pp. 531–533.

Eisenstein et al., "Independently Contacted Two–Dimensional Electron Systems in Double Quantum Wells," *Applied Physics Letters* 57(22), Nov. 1990, pp. 2324–2326.

Boebinger et al., "Magnetic–Field–Driven Destruction of Quantum Hall States in a Double Quantum Well," *Physical Review Letters*, vol. 64, No. 15, 9 Apr. 1990, pp. 1793–1796.

*Primary Examiner*—Mark V. Prenty
*Attorney, Agent, or Firm*—Michael Zelenka; William H. Anderson

[57] ABSTRACT

A method and apparatus for finding internal charge flow distribution in a dual-channel field effect semiconductor device having at least two source terminals, two drain terminals, a control gate and two isolation gates. Electrical energy of different frequencies is applied to different ones of the source terminals for causing currents to flow in each of the channels between the source and drain terminals. Using the isolation gates to achieve channel pinch off, one of the drain terminals and one of the source terminals are selectively coupled to only one of the channels. A control signal is applied to the control gate for controlling the amount of the electrical energy conducting in each of the channels. Data is collected by measuring currents at the different frequencies at each of the drain terminals while a magnetic field perpendicular to the plane of the channels is varied. The data is subjected to a Schubnikov-de Haas analysis to find the amounts of source currents flowing in each of the channels and at each of the drain terminals.

20 Claims, 6 Drawing Sheets

METHOD AND APPARATUS FOR PERFORMING INTERNAL DEVICE STRUCTURE ANALYSIS OF A DUAL CHANNEL TRANSISTOR BY MULTIPLE-FREQUENCY SCHUBNIKOV-DE HAAS ANALYSIS

GOVERNMENT INTEREST

The invention described herein may be manufactured, used and licensed by or for the Government for governmental purposes without the payment to me of any royalties thereon.

BACKGROUND OF THE INVENTION

1. Field of the Invention

This invention relates generally to the field of semiconductor devices. More particularly, the invention relates to methods and apparatus for finding internal charge flow patterns in dual-channel, high-electron-mobility transistors (DCHEMT) and similar devices.

2. Description of the Prior Art

A limiting factor in the switching speed of most existing field-effect transistors is the transit time, which is usually fixed by the gate length. The available lithography normally limits attempts to reduce transit times by decreasing the gate length. However, with the recent arrival of the DCHEMT, significant reductions in transit times beyond those attained by simply decreasing the gate length have been possible. Reductions in transit times are possible in the DCHEMT because electron transport takes place in the vertical as well as the usual lateral direction.

Descriptions of the conduction properties of DCHEMT's appear in: Smith et al., "A Selectively-Contacted Dual Channel High Electron Mobility Transistor," *Army Science Conference Proceedings,* Vol. 3, 1990, pp 347–350; and Khanna et al., "A Selectively Contacted Dual-Channel HEMT," *IEEE Electron Device Letters,* Vol. 10, No. 12, December 1989, pp 531–533. These publications, which are incorporated herein by reference, discuss the transport mechanisms in planar DCHEMT's and the importance of being able to predict the internal current flow patterns for accurate DCHEMT design.

Detailed descriptions of the structure and operation of a DCHEMT also appear in U.S. Pat. No. 4,821,093 issued to Iafrate et al. on Apr. 11, 1989. The Iafrate et al. patent and the Smith et al. and Khanna et al. publications teach various device patterns that achieve selective contact between the device terminals and the semiconductor channel layers, thereby producing the so called selectively contacted DCHEMT (referred to herein as the SCDC HEMT). A technique for creating selective contacts to double quantum wells appears in: Eisenstein et al., "Independently contacted two-dimensional electron systems in double quantum wells," *Applied Physics Letters,* 57(22), November 1990, pp 2324–2326.

As the above references show, especially the Smith et al. and Khanna et al. publications, a DCHEMT normally has two source terminals, two drain terminals, two channels, and at least one control gate. Operation of a SCDC HEMT essentially requires current to flow from both source terminals to both drain terminals. A control voltage applied to the control gate usually establishes the relative amount of current flowing at the drain terminals. This control voltage essentially controls the internal current flow distribution of the SCDC HEMT by varying the conductance of the two channels. Although this conduction mechanism has been generally recognized, it has never been known how the current input to one source terminal redistributes itself among the two drain terminals, or which of the channels carries particular source currents. Semiconductor device designers consider this information to be critical in modeling such devices and tailoring their construction to provide particular functions.

SUMMARY OF THE INVENTION

The general purpose of this invention is to provide a method and an apparatus that allows an SCDC HEMT device designer to track from input to output the current flow patterns in the device. Specifically, the present invention involves a method and apparatus for detecting the amounts of source currents flowing out of each of the drain terminals in an SCDC HEMT or like device. Further, the method and apparatus of the present invention makes possible the determination of the fraction of each of the source currents that flow in each of the dual channels.

Broadly, the present invention is directed to a method and apparatus for finding internal charge flow distribution in a multi-channel field effect semiconductor device. The apparatus includes a field effect semiconductor device having a plurality of terminals and at least two planar channels selectively coupled to the terminals. Each channel has current carriers for conducting electrical energy between the terminals. An electrical potential source connects to at least two of the terminals for applying electrical energy at different frequencies to the device. A control gate is mounted on the device for controlling the amount of electrical energy conducting in each of the channels. A current measuring device connects to at least one of the terminals for measuring currents at the different frequencies. An adjustable magnet applies magnetic fields of different magnitudes perpendicular to the plane of the channels.

More specifically, the invention includes a field effect semiconductor device having at least two source terminals and two drain terminals. An electrical potential connects to the source terminals for applying electrical energy at different frequencies to each of the source terminals. At least two planar channels are coupled to the source and drain terminals with each of the channels having carriers for conducting the electrical energy between the source and drain terminals. A control gate is mounted on the device for controlling the amount of the electrical energy conducting in each of the channels. A current measuring device connects to the drain terminals for measuring currents at the different frequencies at each of the drain terminals. A magnet is mounted for applying a magnetic field perpendicular to the plane of the planar channels.

Another aspect of the invention includes a method for finding internal charge flow distribution in a multi-channel field effect semiconductor device comprising the steps of: (1) providing a field effect semiconductor device having at least two source terminals and two drain terminals; (2) applying electrical energy of different frequencies to different ones of the source terminals; (3) coupling at least two planar channels to the source and drain terminals with each of the channels having carriers for conducting the electrical energy between the source and drain terminals; (4) applying a control signal to a control gate mounted on the device for controlling the amount of the electrical energy conducting in each of the channels; measuring currents at the different frequencies at each of the drain terminals; and applying a magnetic field perpendicular to the plane of the planar channels.

More specifically, the invention is directed to a method and apparatus for finding internal charge flow distribution in a dual-channel field effect semiconductor device having at least two source terminals, two drain terminals, a control gate and two isolation gates. Electrical energy of different frequencies is applied to different ones of the source terminals for causing currents to flow in each of the channels between the source and drain terminals. Using the isolation gates to achieve channel "pinch off," one of the drain terminals and one of the source terminals are selectively coupled to only one of the channels. A control signal is applied to the control gate for controlling the amount of the electrical energy conducting in each of the channels. Data is collected by measuring currents at the different frequencies at each of the drain terminals while a magnetic field perpendicular to the plane of the channels is varied. The data is subjected to a Schubnikov-de Haas analysis to find the amounts of source currents flowing in each of the channels and at each of the drain terminals.

It is, therefore, an object of the present invention to provide a method and an apparatus for finding the current distribution within a dual-channel transistor device.

Another object of the invention is the provision of a method and an apparatus for determining, in a semiconductor device having a plurality of source terminals and drain terminals, the fraction of the input currents at the source terminals that flows out of each of the drain terminals.

A further object of the invention is to provide a method and an apparatus for determining, in a dual-channel semiconductor device having a plurality of source terminals, the fraction of the source currents that flows in each of the dual channels.

The exact nature of this invention and other objects and advantages thereof will be readily apparent from consideration of the following specification relating to the annexed drawing wherein like reference numerals correspond to like parts throughout the several views.

DETAILED DESCRIPTION OF THE PREFERRED EMBODIMENTS

Figure 1:
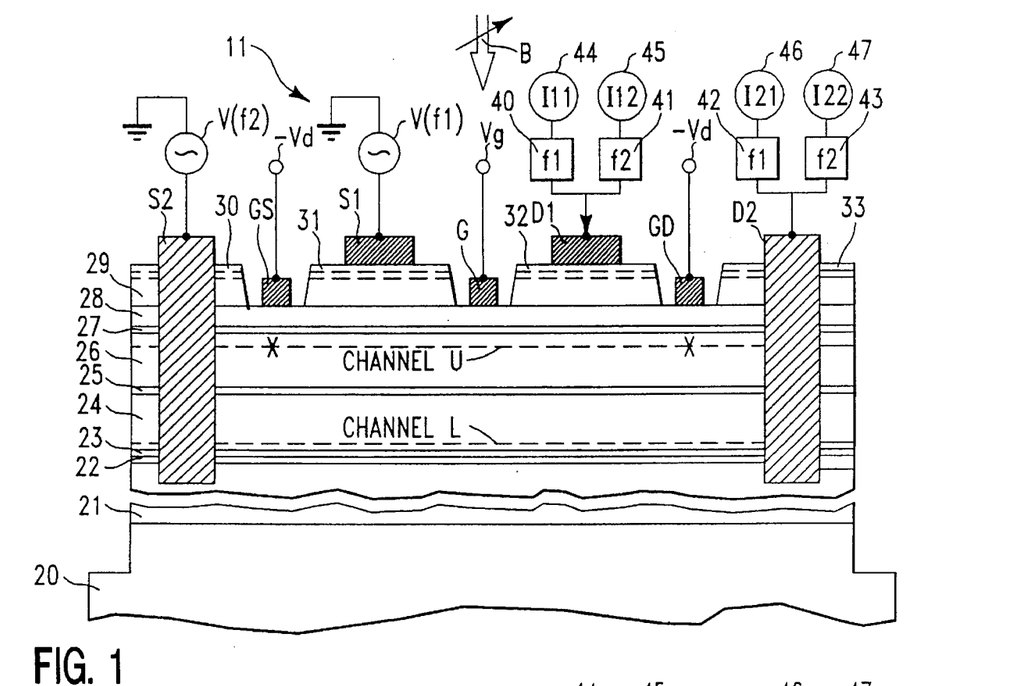
FIG. 1 is a schematic representation of a preferred embodiment of a test apparatus according to the present invention showing a greatly enlarged vertical cross section of an SCDC HEMT.
Figure 2:
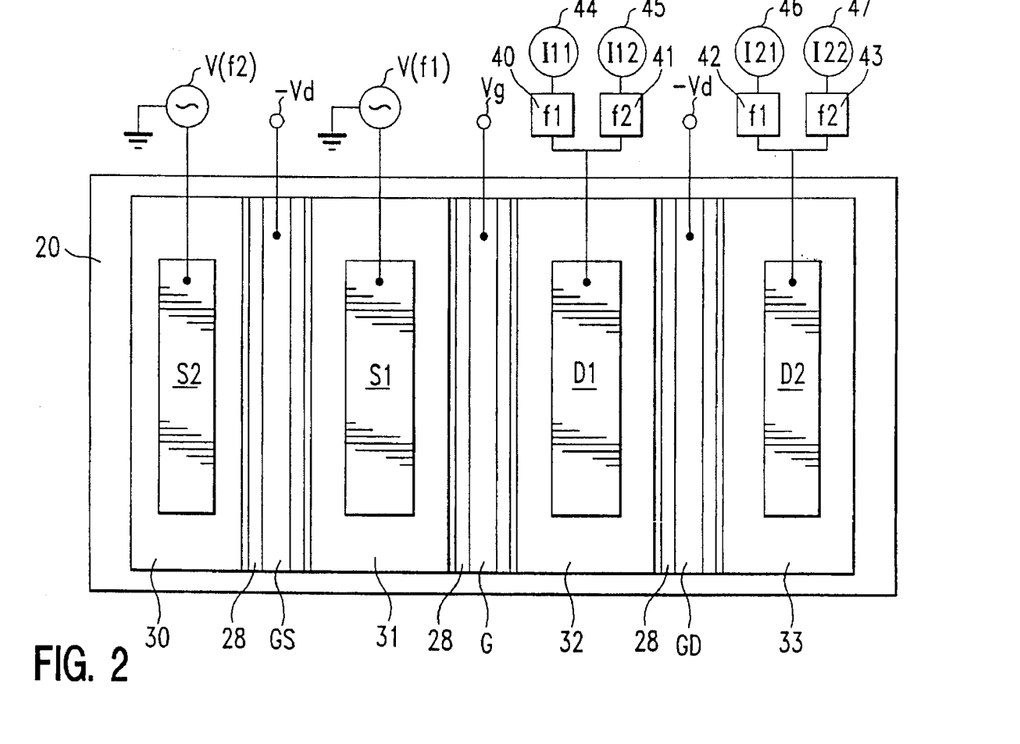
FIG. 2 is a schematic representation of a top view of the apparatus of FIG. 1.

Referring now to the drawings, FIGS. 1 and 2 show a selectively contacted, dual-channel, high-electron-mobility transistor (SCDC HEMT) 11 formed in a planar pattern. SCDC HEMT 11 may be fabricated as a discrete circuit, as shown in FIGS. 1 and 2, or as part of an integrated circuit. In either case, SCDC HEMT 11 mounts on a conventional semiconductor substrate 20. Preferred fabrication methods, generally known to those skilled in these arts, include the use of standard molecular beam epitaxial (MBE) techniques.

SCDC HEMT 11 comprises a planar semiconductor epilayer structure formed from the following semiconductor layers, which are superimposed on undoped gallium arsenide (GaAs) substrate 20:

aluminum gallium arsenide (AlGaAs) barrier layer 21, n-AlGaAs doped layer 22,

AlGaAs spacer layer 23,

GaAs channel layer 24,

AlGaAs barrier layer 25,

GaAs channel layer 26,

AlGaAs spacer layer 27, n-AlGaAs doped layer 28, and $n^{+++}$-GaAs delta-doped layer 29.

Layer 29 comprises four n+++-GaAs delta-doped caps 30–33, which form three trenches therebetween. Caps 30–33 may be formed by very heavily doping a continuous layer 29 with silicon (Si) impurities at the epilayer surface and then etching layer 29 to form the trenches. FIG. 1 depicts the delta-doped regions with a pair of dashed lines near the upper surfaces of caps 30–33.

The upper tier of SCDC HEMT 11 includes three Schottky barrier gates and four ohmic contacts. The Schottky barrier gates consist of isolation source gate GS, transistor control gate G, and isolation drain gate GD. These gates occupy the respective trenches formed between caps 30–33 and contact the upper surface of n-AlGaAs layer 28.

The ohmic contacts consist of source terminals S1, S2 and drain terminals D1, D2. Source terminal S1 and drain terminal D1 combine with the delta-doped regions of caps 31 and 32, respectively, to form ohmic contacts on either side of control gate G. Source terminal S2 and drain terminal D2 mount on opposite sides of and extend deep into SCDC HEMT 11.

GaAs channel layers 24 and 26 function as twin quantum wells separated by AlGaAs barrier layer 25. N-AlGaAs layers 22 and 28, which may contain Si impurities as its dopant, function as carrier sources for providing electrons to channel layers 24 and 26, respectively. These electrons move through spacer layers 23 and 27 into the quantum wells of channel layers 24 and 26 to produce a pair of two-dimensional electron gas (2DEG) channels U and L.

Upper 2DEG channel U resides in GaAs layer 26 while lower 2DEG channel L resides in GaAs layer 24. FIG. 1 illustrates upper channel U and lower channel L with broken horizontal lines at the upper and lower interfaces of layers 26 and 24, respectively. Barrier layer 25 provides a certain measure of electrical isolation between channels U and L. Under operating conditions, electrons may move between channels U and L by tunneling or otherwise crossing barrier layer 25.

AlGaAs barrier layer 21 prevents electrons in doped layer 22 from moving into substrate 20. Spacer layers 23 and 27 space the electrons in channels U and L from the resultant positive charges that are left behind in doped layers 22 and 28.

The ohmic contacts of terminals S1, S2, D1, and D2 provide selective contact to channels U and L. There are two main electrical requirements for obtaining selective contact between terminals S1, S2, D1, and D2: (1) during fabrication, metal from the ohmic contacts of terminals S1 and D1 must be prevented from penetrating into lower channel L, and (2) the metal from the ohmic contacts of terminals S2 and D2 must effectively contact only lower channel L.

The requirement (1) is met by forming terminals S1 and D1 as nonalloyed, delta-doped contacts. When forming terminals S1 and D1, the fabricator deposits metal on the epilayer surface of the delta-doped (very heavily doped) $n^{+++}$-GaAs caps 31 and 32. This deposited metal forms an ohmic contact with the delta-doped regions without being alloyed. As such, the delta-doped, nonalloyed construction insures that terminals S1 and D1 conductively communicate with channel U while preventing metal from penetrating lower channel L.

However, achieving selective contact between lower channel L and terminals S2 and D2 is more complicated. In order to form the deep contacts of terminals S2 and D2, the fabricator must alloy ohmic metal at a sufficiently high temperature to cause the metal to diffuse deep enough into the device so that lower channel L is conductively contacted. Unfortunately this approach causes terminals S2 and D2 to contact both channels U and L, thereby electrically shorting upper channel U to lower channel L. The requirement (2) for achieving selective contact, i.e., terminals S2 and D2 must effectively contact only lower channel L, is met by reverse biasing isolation gates GD and GS with a depletion voltage –Vd of sufficient magnitude to cause channel pinch off. At channel pinch off, depletion voltage –Vd causes substantially full depletion of the electrons in upper channel U in the regions immediately below isolation gates GD and GS. FIG. 1 depicts channel pinch off with X'd-out portions in upper channel U immediately below gates GD and GS. Consequently, channel pinch off effectively isolates terminals S2 and D2 from the main portion of channel U, which is that portion below control gate G extending between source and drain terminals S1 and D1. The magnitude of voltage –Vd that is used to achieve pinch off is kept to a minimum so that voltage –Vd will have no appreciably effect on the electron carriers in lower channel L.

SCDC HEMT 11 normally operates, as seen in the Smith et al. and Khanna et al. publications, cited above, by applying dc input voltages to source terminals S1, S2 and feeding the resulting output currents at drain terminals D1, D2 to loads while varying control voltage Vg. During device operation, control voltage Vg controls the internal current flow in channels U and L by varying the number of electron carriers therein.

Typically, control voltage Vg can cause direct currents entering source terminal S1 to flow either in upper channel U, or lower channel L, or both. Control voltage Vg can switch these currents and, therefore, the output voltage values at terminals D1 and D2 at significantly higher speeds than was previously possible with conventional transistors. However, in order to tailor SCDC HEMT 11 by varying its material composition, layer sizes, dopant concentrations, etc., it is important that designers know how the current input to one source terminal, say terminal S1, redistributes itself among drain terminals D1 and D2, and what fraction of the input currents can be made to conduct in each of channels U and L. Manifestly, semiconductor device designers consider this information critical when modeling such devices and tailoring their construction and functions.

To obtain information on specific current flow distributions in SCDC HEMT 11, designers using the present invention can perform a multiple frequency Schubnikov-de Haas analysis of data collected during a magnetotransport operation of SCDC HEMT 11. Smith et al., cited above, teaches the application of a conventional dc Schubnikov-de Haas analysis to data obtained during magnetotransport experiments performed on a series of gated Hall bars.

The multiple frequency Schubnikov-de Haas analysis of the present invention generally involves making magnetotransport measurements on SCDC HEMT 11 while applying ac voltage sources of different frequencies to source terminals S1, S2. Drain currents are then measured while applied magnetic field B and gate voltages –Vd, Vg are varied. These measurements produce data which is recorded, analyzed and manipulated to produce a set of results which give the fractional amounts of current in each of channels U, L as a function of control voltage Vg. Of course, based on the present teachings, it is clear that one of ordinary skill in the art may fully automate and computerize the process of the present invention.

Specifically and as shown in FIGS. 1 and 2, a first ac voltage source V(f1) at frequency f1 connects to source terminal S1. A second ac voltage source V(f2) at frequency f2 connects to source terminal S2. A set of band-pass filters 40–43 and current meters 44–47 connect to drain terminals D1 and D2. Meter 44 measures current I11 at frequency f1 as passed by band-pass filter 40 from terminal D1. Band-pass filter 41 passes current I12 at frequency f2 from terminal D1 to meter 45. Band-pass filter 42 passes current I21 at frequency f1 from terminal D2 to meter 46. Band-pass filter 43 passes current I22 at frequency f2 from terminal D2 to meter 47. Lastly, a magnetic field B is directed perpendicular to the broad plane of channels U and L.

Figure 3:
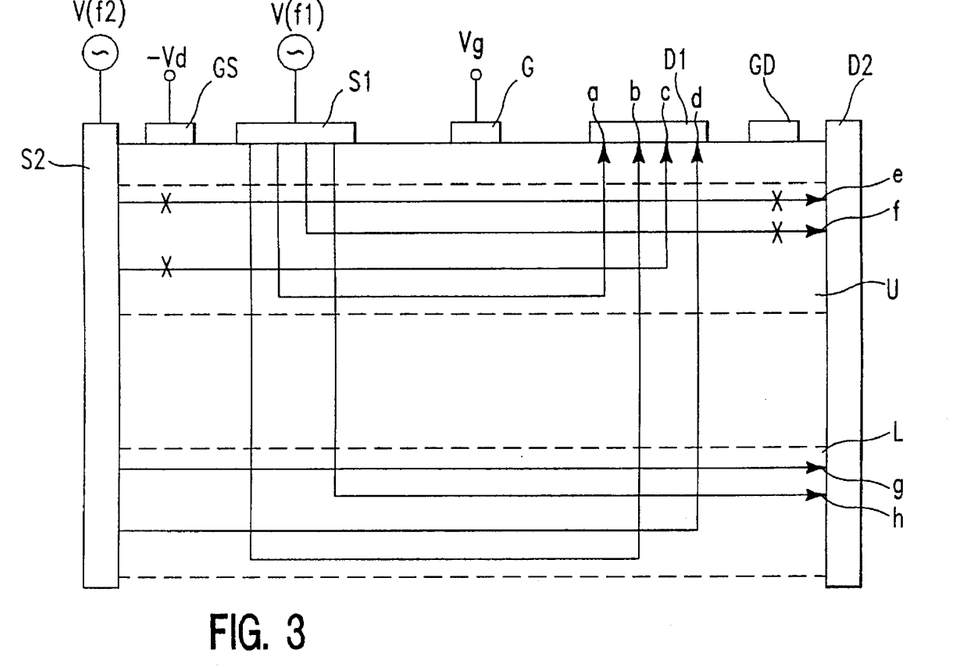
FIG. 3 is a schematic representation of the apparatus of FIG. 1 illustrating the current paths therein.

FIG. 3 schematically shows the eight possible currents, labeled as currents a–h, that exist in channels U and L. Specifically, currents a–d flow at drain terminal D1 while currents e–h at drain terminal D2. Currents a, b, f, h originate at source terminal S1 and have frequency f1 while currents c, d, e, g originate at source terminal S2 and have frequency f2. Currents a, c, e, f flow through upper channel U while currents b, d, g, h flow through lower channel L.

Measured current I11, which has frequency f1, corresponds to the currents flowing from terminal S1 to terminal D1. Comparing FIGS. 1 and 3 shows that current I11 is the sum of currents a and b, which flow through different ones of the respective channels U and L. FIG. 3 shows that current I12 is the sum of currents c and d, which flow through channels U and L, respectively. Further, measured current I21, with frequency f1, is the sum of currents f and h, which flow through channels U and L, respectively. Finally, measured current I22, having frequency f2, is the sum of currents e and g flowing through channels U and L, respectively.

As indicated above, the multiple frequency Schubnikov-de Haas analysis of the present invention involves making magnetotransport measurements on SCDC HEMT 11 while ac voltages V(f1) and V(f2) are applied to source terminals S1, S2. Drain currents I11, I12, I21 and I22 are measured and recorded as magnetic field B, gate voltage Vg and depletion voltage –Vd are varied.

Figure 4:
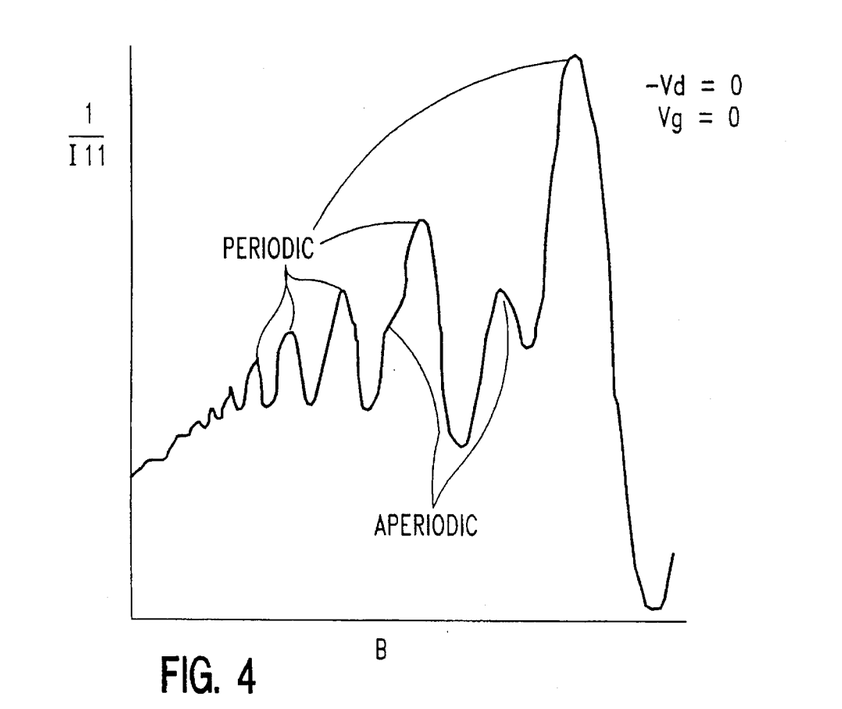
FIG. 4 is a graphical representation of data obtained from the device of FIGS. 1 and 2.

Initially, magnetic field B and voltages Vg, –Vd are set to zero. The values of currents I11, I12, I21, I22 measured by meters 44–47 are recorded. A data run is performed while magnet field B is varied through a predetermined set of values to some maximum value and the measured currents I11, I12, I21, I22 are recorded. FIG. 4 graphically illustrates data recorded for current I11 during a single data run. Similar sets of data for currents I12, I21, I22 are recorded as magnet field B is varied. FIG. 4 shows how the reciprocal current values 1/I11 of current I11 varies as magnetic field B is varied while voltages Vg, −Vd are set at zero. Next, control voltage Vg is lowered through a series of values and the data runs are repeated for each value of voltage Vg. When the final value of voltage Vg is reached, the magnitude of depletion voltage −Vd is increased and the above process repeated. This recording process is continued until the final value of voltage −Vd is reached.

Figure 5:
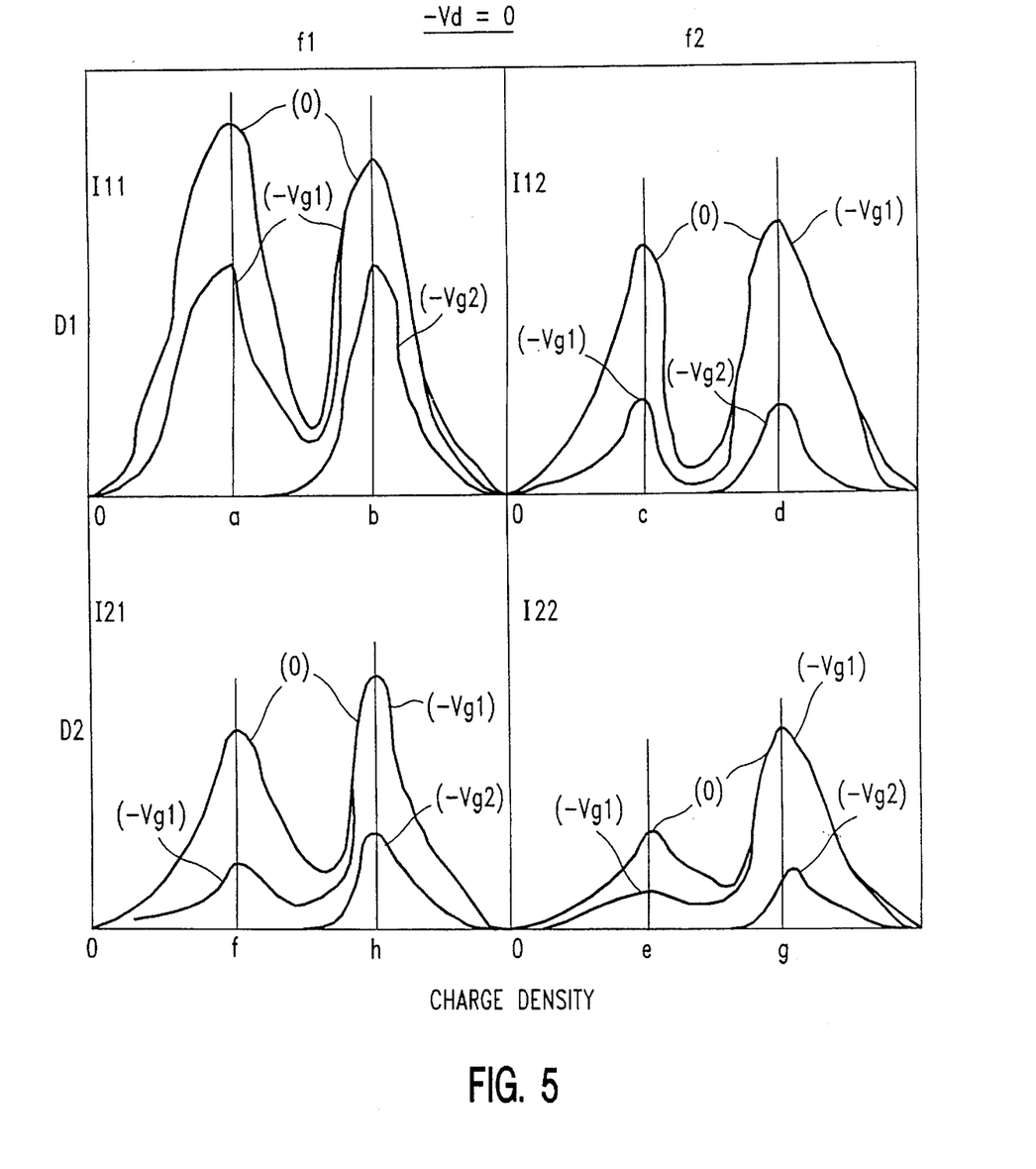
FIGS. 5 and 6 are graphs of data obtained by conducting a Fourier transform on data such as that represented in the graph of FIG. 4.
Figure 6:
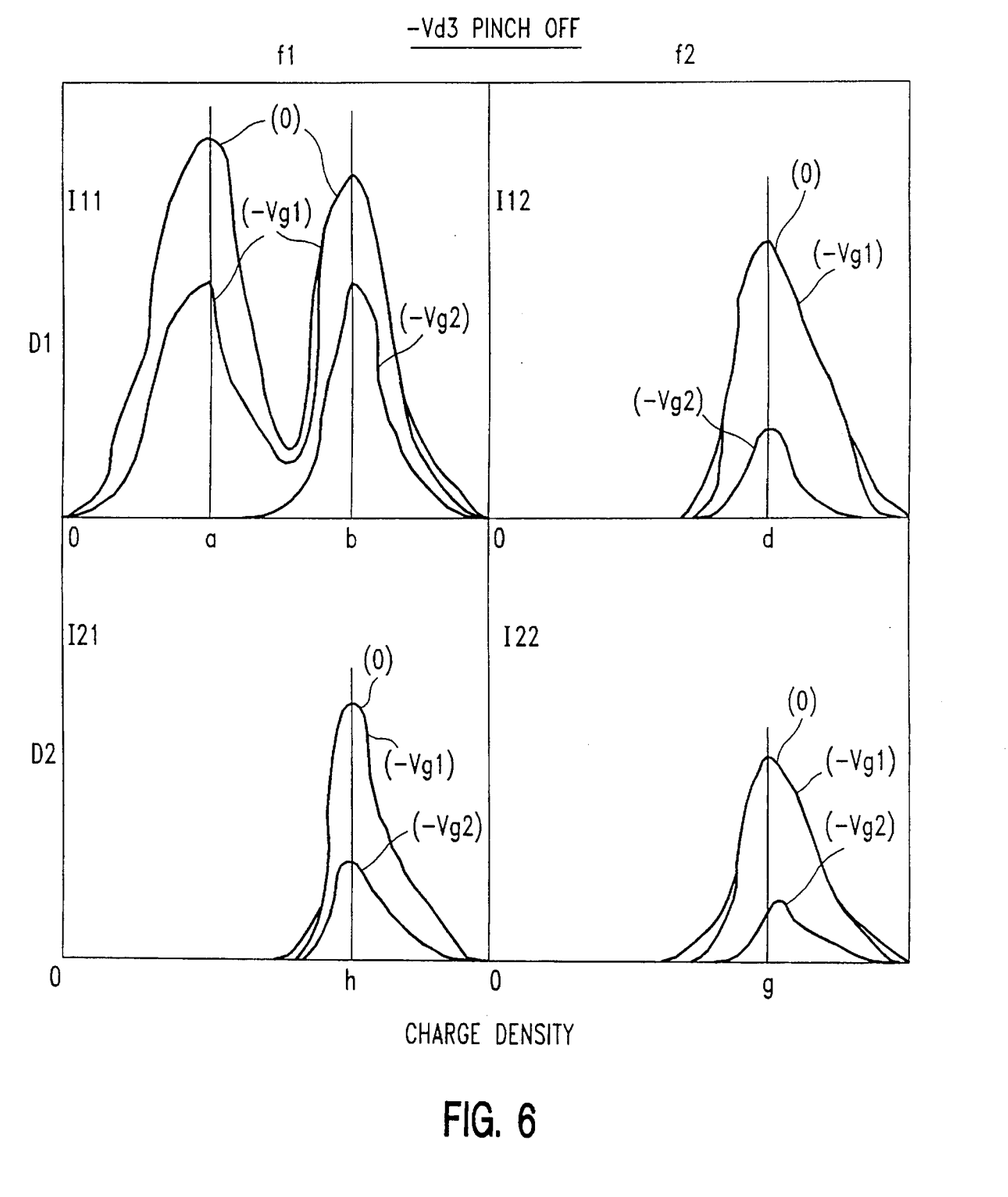

The FIG. 4 curve shows by way of example that the reciprocal of the drain currents I11–I22 with respect to magnetic field B normally consists of a periodic component and an aperiodic component. In a conventional manner, these components can be resolved by transforming the data to 1/B space and subjecting it to a Fourier transformation. FIGS. 5 and 6 show curves of the resulting Fourier transforms. In these Fourier transform curves, the vertical axes represent current and the horizontal axes represent charge density.

The curves in FIGS. 5 and 6 are arranged in a four-element matrix having two rows and two columns. The rows correspond to the currents flowing at the respective drain terminals D1 and D2. The columns correspond to the currents flowing at the respective frequencies (f1) and (f2). For example, the curves located at the top row and the left column correspond to the data recorded for current I11, which is made up of currents a and b.

The Fourier transform curves shown in FIG. 5 correspond to data recorded during data runs when depletion voltage −Vd was set at zero. FIG. 6 data corresponds to data runs in which depletion voltage −Vd was set at the pinch-off voltage, designated here as voltage −Vd3. Consequently, each matrix location in FIGS. 5 and 6 includes a family of curves illustrating how the associated currents varied as a function of control voltage Vg for a particular depletion voltage −Vd. For example, the three curves illustrated at each location in FIG. 5 correspond to data recorded at three different values of control voltage Vg, viz., 0, −Vg1 and −Vg2, while depletion voltage −Vd was set at zero.

The family of curves at the top-left location in FIG. 5 has two peaks which show the component currents a and b, i.e., those fractions of current I11 that flow in upper channel U and lower channel L. The curve peaks at the top-right location in FIG. 5 show the component currents c and d, which make up current I12. The curve peaks at the bottom-left location in FIG. 5 show the component currents f and h, which make up current I21. The curve peaks at the bottom-right location in FIG. 5 show the component currents e and g, which make up current I22.

The family of curves in FIG. 6, which are similar to those in FIG. 5, show the component currents a–h for currents I11-I22 with depletion voltage −Vd set at the pinch-off voltage −Vd3. As explained above, pinch off occurs when carriers in upper channel U immediately below gates GS and GD are sufficiently depleted such that terminals S2 and D2 are conductively isolated from upper channel U for all values of control voltage Vg. In the example shown, channel pinch off prevents currents c, e and f from flowing, as indicated by the X's in FIG. 3. It is for this reason that no current peaks appear for currents c, e and f in the curves of FIG. 6.

The peak values produced by the Fourier transform data reveal the relationships between control voltage Vg and component currents a–h. The curves of FIGS. 7A–7D, which are plots of the peak values, such as those found in FIGS. 5 and 6, graphically illustrate these relationships. The FIG. 7A curves are plots of the peak values of Fourier transforms for the data recorded when depletion voltage −Vd was set to zero. Some of these peak values can be seen in the curves of FIG. 5. Likewise, the FIG. 7D curves represent the peak values of the Fourier transforms for the data recorded when depletion voltage −Vd was set to −Vd3, the pinch-off voltage. Some of these peak values can be seen in the curves of FIG. 6. The curves of FIGS. 7B and 7C represent the peak values of the Fourier transforms for data recorded when depletion voltage −Vd was set to some intermediate values, e.g., −Vd1 and −Vd2. The currents flowing in lower channel L, i.e., currents b, d, g and h, are plotted with solid lines in FIGS. 7A–7D. The currents flowing in upper channel U, i.e., currents a, c, e and f, are plotted with dashed lines in FIGS. 7A–7D.

It can be seen in FIGS. 7A–7D that currents a, c, f and e in upper channel U decrease gradually to zero as the magnitude of the control voltage Vg increases. On the other hand, currents b, d, g and h in lower channel L remain substantially constant until control voltage Vg has exceeded value −Vg1 after which they gradually decrease to zero.

It can also be seen from FIGS. 7A–7D that as the magnitude of the depletion voltage −Vd increases from zero to pinch-off voltage −Vd3, only the responses of currents c, e and f are effected. These currents c, e and f are those flowing in upper channel U immediately below isolation gates GS and GD, and, as such, are those which must be pinched off so that terminals S2 and D2 are conductively isolated from upper channel U. More specifically, as the magnitude of voltage −Vd increases, currents c, e and f gradually decrease from a maximum range of values in FIG. 7A to zero in FIG. 7D, indicating that channel pinch off has occurred.

The semiconductor designer can, therefore, accurately locate the appropriate pinch-off voltage by finding that set of data that first causes currents c, f and e to be zero for all values of control voltage Vg. Because the current response at channel pinch off corresponds to the data shown in FIG. 7D, the designer knows how current inputs at source terminal S1, S2 redistribute themselves among drain terminals D1, D2 and channels U and L. Using similar data from devices having different material compositions, dopant concentrations, layer thicknesses, etc., the designer may create computer models of SCDC HEMT and other dual channel devices.

Obviously, many modifications and variations of the present invention are possible in the light of the above teachings. For example, although it is important that voltage sources V(f1) and V(f2) have different frequencies, so that the origin of currents I11-I22 can be resolved at drain terminals D1 and D2, it is also possible to make one of frequencies f1 and f2 equal to zero since dc currents and ac currents can be resolved. Additionally, the present invention applies to multi-channel semiconductor devices in general and, therefore, is not to be limited to the SCDC HEMT configuration of FIG. 1.

Figure 8:
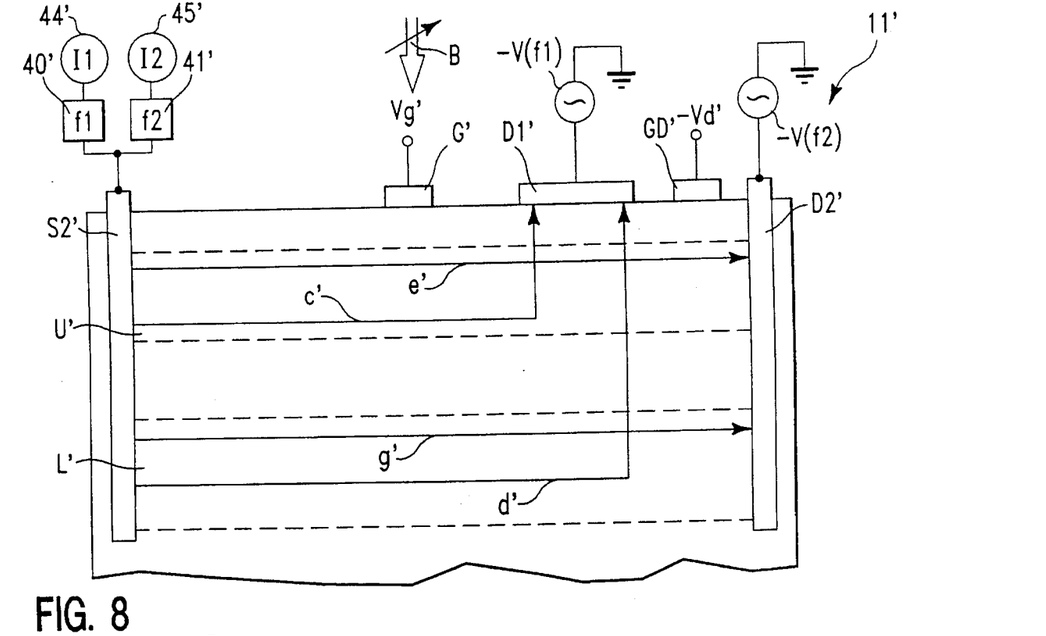
FIG. 8 is a schematic representation of an alternate embodiment of the invention illustrating the current paths therein in a manner similar to that shown in FIG. 3 for the FIG. 1 embodiment.

For example FIG. 8 shows a selectively contacted, dual-channel, high-electron-mobility transistor (SCDC HEMT) 11', which is similar to (SCDC HEMT) 11 except that (SCDC HEMT) 11' has only one source terminal instead of two. Additionally, current meters 44' and 45' and band-pass filters 40' and 41' are connected to source terminal S2'. Further, ac voltage sources −V(f1) and −V(f2) of different frequencies are connected to the respective drain terminals D1' and D2'. Control voltage Vg' is connected to control gate G' and depletion voltage −Vd' is connected to isolation gate GD'. These voltages control the currents in upper channel U' and lower channel L'. Currents I1 and I2 are made up of currents c' and e' which flow in upper channel U' and currents g' and d' which flow in lower channel L'. Specifically, current I1 consists of currents c' and d', which have frequency f1, and current I2 consists of currents e' and g', which have frequency f2.

Applying the multiple frequency Schubnikov-de Haas analysis of the present invention, as described above, to the SCDC HEMT 11' embodiment, semiconductor designers can determine how the current input to source terminal S2' redistributes itself among drain terminals D1' and D2', and what fraction of these currents can be made to conduct in each of channels U' and L'. As indicated above, this analysis generally involves making magnetotransport measurements on SCDC HEMT 11' while applying ac voltage sources −V(f1) and −V(f2) to drain terminals D1' and D2'. Currents are then measured at source terminal S2' while applied magnetic field B and gate voltages −Vd' and Vg' are varied. These measurements produce data which is recorded, analyzed and manipulated, as described above, to produce a set results giving the fractional amounts of current in each of channels U' and L' as a function of control voltage Vg'. These results are represented with the curves shown in FIGS. 9A and 9B, wherein the solid curves represent currents in lower channel L' and the dashed curves represent currents in upper channel U'.

Figure 7A:
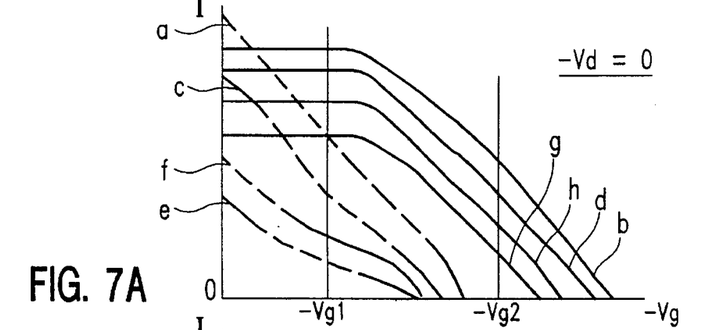
FIGS. 7A–7D are graphs showing the current responses for the device of FIGS. 1 and 2.
Figure 7B:
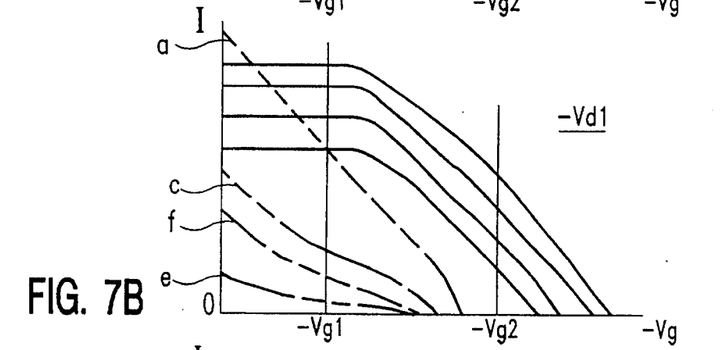
Figure 7C:
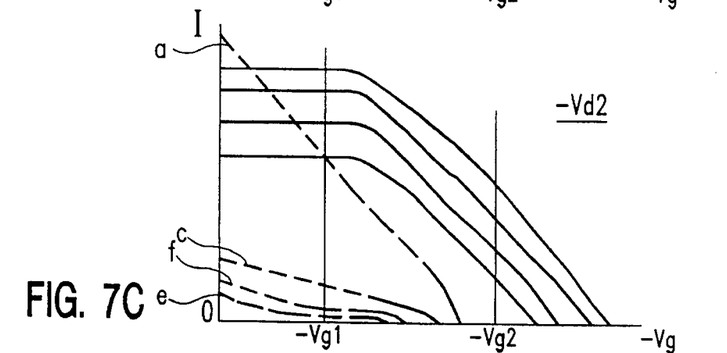
Figure 7D:
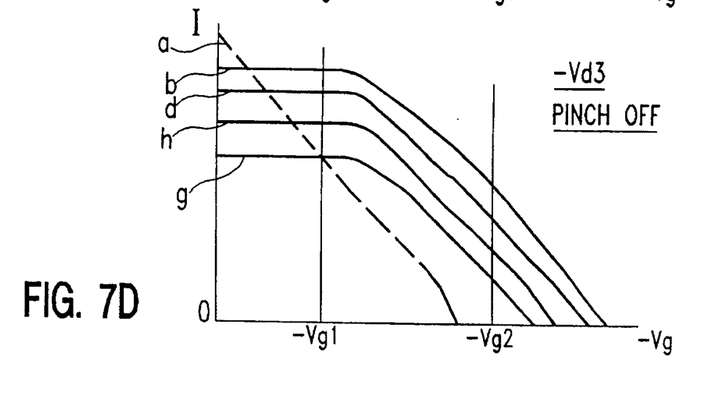
Figure 9A:
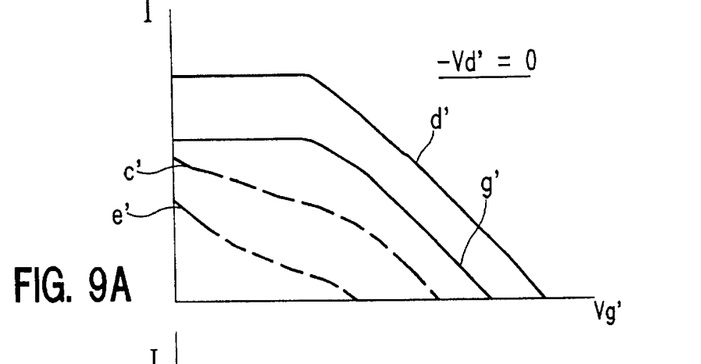
FIGS. 9A–9b are graphs showing the current responses for the device of FIG. 8.
Figure 9B:
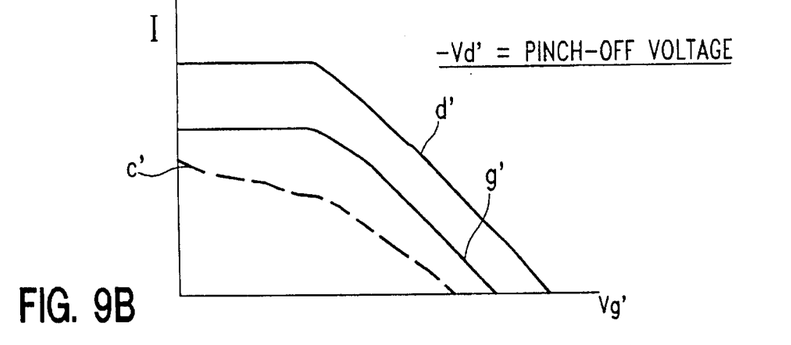

The curves of FIG. 9A correspond to those shown in FIG. 7A and represent the peak values of the Fourier transform for data recorded when depletion voltage −Vd' was set to zero. The curves of FIG. 9B, which correspond to those shown in FIG. 7D, represent the peak values of the Fourier transform data obtained when depletion voltage −Vd' was set to the pinch-off voltage. Of course, similar curves can be obtained for other embodiments of dual-channel, high-electron-mobility transistors and similar devices.

Therefore, it should be understood that the foregoing disclosure relates to only preferred embodiments of the invention and that numerous other modifications or alterations may be made therein without departing from the spirit and the scope of the invention as set forth in the appended claims.

What is claimed is:

1. Apparatus for finding the internal charge flow distribution in a multi-channel field effect semiconductor device comprising:

a field effect semiconductor device having a plurality of terminals and at least two planar channels selectively coupled to said terminals, each said channel having current carrier means for conducting electrical energy between said terminals;

potential means connected to at least two of said terminals for applying electrical energy at different frequencies thereto;

a control gate means mounted on said device for controlling the amount of said electrical energy conducting in each said channel;

current measuring means for measuring currents at said different frequencies at said at least one of said terminals; and adjustable magnetic means for applying magnetic fields of different magnitudes perpendicular to the plane of said channels.

2. The apparatus of claim 1 further including isolation gate means mounted on said device having carrier depletion means for causing channel pinch off of one of said channels with respect to at least one of said terminals.

3. The apparatus of claim 1 wherein at least two of said terminals conductively contacts at least two of said channels.

4. The apparatus of claim 3 further including isolation gate means mounted on said device and having carrier depletion means for controlling the flow of said energy between one of said channels and one of said terminals.

5. The apparatus of claim 4 wherein said current measuring means includes band-pass filters tuned to said different frequencies.

6. The apparatus of claim 1 wherein said terminals include one source terminal and two drain terminals.

7. The apparatus of claim 6 wherein one of said drain terminals and said source terminal each conductively contact at least two of said channels.

8. The apparatus of claim 7 further including isolation gate means mounted on said device having carrier depletion means for controlling the flow of said energy between one of said channels and said source terminal and one of said drain terminals.

9. The apparatus of claim 8 wherein said current measuring means includes band-pass filters tuned to said different frequencies.

10. The apparatus of claim 1 wherein said terminals include two source terminals and two drain terminals.

11. The apparatus of claim 10 wherein one of said drain terminals and one of said source terminals each conductively contact at least two of said channels.

12. The apparatus of claim 11 further including isolation gate means mounted on said device having carrier depletion means for controlling the flow of said energy between one of said channels and said one of said source terminals and said one of said drain terminals.

13. The apparatus of claim 12 wherein said current measuring means includes band-pass filters tuned to said different frequencies.

14. Apparatus for finding the internal charge flow distribution in a multi-channel field effect semiconductor device comprising:

a field effect semiconductor device having at least two source terminals, two drain terminals and two planar channels selectively coupled to said source and drain terminals, each said channel having current carrier means for conducting electrical energy from said source terminals to said drain terminals;

potential means connected to said source terminals for applying electrical energy at different frequencies to different ones of said source terminals;

a control gate means mounted on said device for controlling the amount of said electrical energy conducting in each said channel;

current measuring means connected to said drain terminals for measuring currents at said different frequencies at each of said drain terminals; and adjustable magnetic means for applying magnetic fields of different magnitudes perpendicular to the plane of said channels.

15. The apparatus of claim 14 wherein one of said source terminals and one of said gate terminals each conductively contact at least two of said channels.

16. The apparatus of claim 15 further including isolation gate means mounted on said device having carrier depletion means for controlling the flow of said energy between one of said channels and said one source terminal and said one drain terminal, and wherein said current measuring means includes band-pass filters tuned to said different frequencies.

17. A method for finding internal charge flow distribution in a multi-channel field effect semiconductor device comprising the steps of:

providing a field effect semiconductor device having a plurality of terminals and at least two planar channels selectively coupled to said terminals;

applying electrical energy of different frequencies to different ones of said terminals;

conducting said electrical energy between said terminals;

applying a control signal to a control gate mounted on said device for controlling the amount of said electrical energy conducting in each said channel;

applying a magnetic field perpendicular to the plane of said channels;

applying a depletion voltage to control the flow of said energy between one of said channels and said terminals; and measuring and recording current data at said different frequencies at one of said terminals for different values of said magnetic field, said control signal and said depletion voltage, whereby said data is subjected to a Schubnikov-de Haas analysis to find the amounts of source currents flowing in each of said channels from each of said terminals.

18. A method for finding internal charge flow distribution in a multi-channel field effect semiconductor device comprising:

providing a field effect semiconductor device having at least two source terminals and two drain terminals;

applying electrical energy of different frequencies to different ones of said source terminals;

coupling at least two planar channels to said source and drain terminals, each said channel having carrier means for conducting said electrical energy between said source and drain terminals;

applying a control signal to a control gate mounted on said device for controlling the amount of said electrical energy conducting in each said channel;

applying a magnetic field perpendicular to the plane of said planar channels;

applying a depletion voltage to control the flow of said energy between one of said channels and one of said source and drain terminals; and measuring and recording current data at said different frequencies at said drain terminals for different values of said magnetic field, said control signal and said depletion voltage, whereby said data is subjected to a Schubnikov-de Haas analysis to find the amounts of source currents flowing in each of said channels from each of said terminals.

19. The method of claim 18 further including conductively contacting at least two of said channels to one of said source terminals and one of said gate terminals.

20. The method of claim 19 wherein the step of applying said depletion voltage includes applying a pinch-off depletion voltage to one of said channels for causing channel pinch off of one of said channels with respect to at least one of said terminals.

* * * * *